(12) United States Patent
Muddu

(10) Patent No.: US 6,314,546 B1
(45) Date of Patent: Nov. 6, 2001

(54) INTERCONNECT CAPACITIVE EFFECTS ESTIMATION

(75) Inventor: Sudhakar Muddu, Santa Clara, CA (US)

(73) Assignee: Silicon Graphics, Inc., Mountain View, CA (US)

(*) Notice: Subject to any disclaimer, the term of this patent is extended or adjusted under 35 U.S.C. 154(b) by 0 days.

(21) Appl. No.: 09/276,992

(22) Filed: Mar. 26, 1999

Related U.S. Application Data

(60) Provisional application No. 60/123,262, filed on Mar. 8, 1999.

(51) Int. Cl.[7] .................................................. G06F 17/50
(52) U.S. Cl. .................................................................. 716/5
(58) Field of Search ................................. 716/1, 2, 4, 5, 716/6

(56) References Cited

U.S. PATENT DOCUMENTS

| | | | |
|---|---|---|---|
| 5,285,165 | 2/1994 | Renfors et al. ........................ | 328/167 |
| 5,544,068 | * 8/1996 | Takimoto et al. ..................... | 364/489 |
| 5,790,415 | * 8/1998 | Pullela et al. ......................... | 364/489 |
| 5,841,672 | * 11/1998 | Spyrou et al. ......................... | 364/488 |

OTHER PUBLICATIONS

Arunachalam et al., "CMOS Gate Delay Models for General RLC Loading," 1997 IEEE, pp. 224–229.*

Hafed et al., "CMOS Inverter Current and Delay Model Incorporating Interconnect Effects," 1998 IEEE, pp. 86–89.*

Kahng et al., "Improved Effective Capacitance Computations for Use in Logic and Layout Optimization," Proc. 12th Int'l Conference on VLSI Design, Jan. 1999 [no page numbers].*

Krauter et al., "Including Inductive Effects in Interconnect Timing Analysis," IEEE 1999 Custom ICs Conference, pp. 445–452.*

(List continued on next page.)

Primary Examiner—Matthew Smith
Assistant Examiner—Leigh Marie Garbowski
(74) Attorney, Agent, or Firm—Baker Botts L.L.P.

(57) ABSTRACT

An non-iterative approach for estimating interconnect capacitive effects. The non-iterative approach includes a method for estimating the interconnect capacitive effects. The method includes modeling the gate and estimating an effective capacitance for the interconnect capacitive effects. The effective capacitance estimation includes modeling the gate load at an output of the gate. The gate load modeling includes approximating an admittance of the gate load to a single capacitance model in addition to approximating the admittance of the gate load to a Π model. The gate load modeling also includes matching a gate response for the Π model with the gate response for the single capacitance model to determine the effective capacitance. Another aspect of the method for estimating the interconnect capacitive effects includes modeling the gate using an equivalent circuit, and modeling the load at an output of the gate. The gate load modeling includes determining Π model parameters that represent the load at the output of the gate. The parameters are associated with a response at the gate output. The effective capacitance estimation method further includes modeling a single capacitive load at the output of the gate. The single capacitive load modeling includes determining a gate delay for a threshold time at a threshold voltage. This delay determination accounts for the input voltage waveform, the voltage response at the gate output and the Π model parameters. The single capacitance modeling the capacitive load is determined using the threshold time. The effective capacitance is then derived taking into account the single capacitance, a total capacitance of the gate load, an intrinsic gate delay and a gate load delay for the total capacitance as a load.

20 Claims, 4 Drawing Sheets

OTHER PUBLICATIONS

Semiconductor Industry Association, National Technology Roadmap for Semiconductors, pages Table of Contents, pp. 1–3, 7–19, 23–113, 163–178, Appendix B1–C8, 1994.

Personal communication, SIA NTRS 1997 Revision, Design and Test Technology Working Group (chairs: R. Howard, P. Verhofstadt), 1997, Table of Contents, pp. 1–3, 8, 10–17, 25–38, 94–109, Appendix B, C and D, 1997.

C. J. Alpert and A. Devgan, "Wire Segmenting for Improved Buffer Insertion", Proc. Design Automation Conf., pp. 558–593, Jun. 1997.

D. P. LaPotin, U. Ghoshal, E. Chiprout, S. R. Nassif, "Physical Design Challenges For Performance", International Symposium on Physical Design, pp. 225–226, Apr. 1997.

L. Scheffer, "A Roadmap Of CAD Tool Changes For Sub–Micron Interconnect Problems", International Symposium on Physical Design, pp. 104–109, Apr. 1997.

R. F. Sechler, "Interconnect design with VLSI CMOS", IBM Journal of Research and Development, pp. 23–31, Jan.–Mar. 1995.

J. Cong, L. He, A. B. Kahng, D. Noice, N. Shirali and S. H.–C. Yen, Analysis And Justification Of A Simple, Practical 2½–D Capacitance Extraction Methodology, Proc. Design Automation Conference, pp. 627–632, Jun. 1997.

L. Gwennap, "IC Vendors Prepare for 0.25–Micron Leap", Microprocessor Report, pp. 11–15, Sep. 16, 1996.

S.Y. Oh, K.–J. Chang, N. Chang and K. Lee, "Interconnect Modeling And Design In High–Speed VLSI/ULSI Systems", Proc. International Conference on Computer Design: VLSI in Computers and Processors, pp. 184–189, Oct. 1992.

H.B. Bakoglu, "Circuits, Interconnections, and Packaging for VLSI," Addison–Wesley Publishing Company, 1990, pp. 202–207, 212–215, 282–285.

A. Devgan, "Efficient Coupled Noise Estimation for On–Chip Interconnects," IEEE International Conference on Computer–Aided Design, Nov. 1997, pp. 147–151

G.A. Katopis and H.H. Smith, "Coupled Noise Predictors for Lossy Interconnects," IEEE Transactions on Components, Packaging, and Manufacturing Technology—Part B. vol. 17, No. 4, Nov. 1994, pp. 520–524.

H. Kawaguchi and T. Sakurai, "Delay and Noise Formulas for Capacitively Coupled Distributed RC Lines," Proc. Asian and South Pacific Design Automation Conference, 1998, pp. 35–43.

K. Rahmat, O.S. Nakagawa, S–Y. Oh and J. Moll, "A Scaling Scheme for Interconnect in Deep–Submicron Processes," IEEE International Electronic Devices Meeting, 1995, pp. 10.2.1–10.2.4.

K.L. Shepard, S.M. Carey, E.K. Cho, B.W. Curran, R.F. Hatch, D.E. Hoffman, S.A. McCabe, G.A. Northrop, R. Seigler, "Design Methodology for the S/390 Parallel Enterprise Server G4 Microprocessors," IBM Journal of Research and Development, vol. 41, No. 4/5, Jul./Sep. 1997, pp. 515–547.

A. Vittal and M. Marek–Sadowska, "Crosstalk Reduction for VLSI," IEEE Transactions on Computer–Aided Design of Integrated Circuits and Systems, vol. 16, No. 3, Mar. 1997, pp. 290–298.

G. Yee, R. Chandra, V. Ganesan and C. Sechen, "Wire Delay in the Presence of Crosstalk," ACM/IEEE International Workshop on Timing Issues in the Specification and Synthesis of Digital Systems, Dec. 97, pp. 170–175.

K.L. Shepard and V. Narayanan, "Conquering Noise in Deep–Submicron Digital Ics," IEEE Design & Test of Computers, Jan.–Mar. 1998, pp. 51–62.

K. Rahmat, J. Neves and J.F. Lee, "Methods for calculating coupling noise in early design: a comparative analysis," IEEE 1998, pp. 76–81.

R. Macys and S. McCormick, "A New Algorithm for Computing the Effective Capacitance in Deep Sub–micron Circuits," IEEE Custom Integrated Circuits Conference, 1998, pp. 313–316.

T. Sakurai, "Closed–Form Expressions for Interconnection Delay, Coupling, and Crosstalk in VLSI's", IEEE Transactions on Electron Devices, vol., 40, No. 1, pp. 118–124, Jan. 1993.

W. C. Elmore, "The Transient Response Of Damped Linear Networks with Particular Regard To Wideband Amplifiers," Journal of Applied Physics, vol. 19, Jan.–Dec. 1948, pp. 55–63.

A.B. Kahng and S. Muddu, "Efficient Gate Delay Modeling For Large Interconnect Loads," Proc. IEEE Multi–Chip Module Conference, Feb. 1996, 6 pages.

A.B. Kahng and S. Muddu, "An Analytical Delay Model For RLC Interconnects," IEEE 1996, pp. 237–240.

A.B. Kahng, K. Masuko and S. Muddu, "Analytical Delay Models For VLSI Interconnects Under Ramp Input", IEEE/ACM International Conference on CAD, Nov. 1996, 7 pages.

A.B. Kahng and S. Muddu, "A Glossary On Analysis And Modeling Of VLSI Interconnections," marked Confidential, including Contents, Feb. 1996, 3 pages.

S.P. McCormick, "Modeling and Simulation of VLSI Interconnections with Moments," RLE Technical Report No. 543, PhD Thesis, MIT, May 1989, No page #s.

J.K. Ousterhout, "A Switch–Level Timing Verifier For Digital MOS VLSI," IEEE Transactions on Computer–Aided Design, vol. CAD–4, No. 3, Jul. 1985, pp. 336–349.

P.R. O'Brien and T.L. Savarino, "Modeling the Driving––Point Characteristic Of Resistive Interconnect For Accurate Delay Estimation,"Proc. IEEE, 1989, pp. 512–515.

P.R. O'Brien and T.L. Savarino, "Efficient On–Chip Delay Estimation For Leaky Models Of Multiple–Source Nets," Proc. IEEE 1990, Custom Integrated Circuits Conference, pp. 9.6.1–9.6.4.

L.T. Pillage, "Asymptotic Waveform Evaluation For Timing Analysis," IEEE Transactions on Computer–Aided Design, vol. 9, No. 4, Apr. 1990, pp. 352–366.

J. Qian, S. Pullela and L. Pillage, "Modeling The Effective Capacitance For The RC Interconnect Of CMOS Gates," IEEE Transactions on Computer–Aided Design of Integrated Circuits and Systems, vol. 13, No. 12, Dec. 1994, pp. 1526–1535.

J. Rubinstein, P. Penfield, Jr. And M.A. Horowitz, "Signal Delay In RC Tree Networks," IEEE Transactions on Computer–Aided Design, vol. CAD–2, No. 3, Jul. 1983, pp. 202–211.

C.L. Ratzlaff, S. Pullela and L. T. Pillage, "Modeling The RC–Interconnect Effects In A Hierarchical Timing Analyzer," IEEE Custom Integrated Circuits Conference, May 1992, pp. 15.6.1–15.6.4.

Synopsys, "Design Compiler Family Reference Manual," Version 3.3a, Mar. 1995, pp. 8–1–8–5.

A.B. Kahng, K. Masuko and S. Muddu, "Analytical Delay Models for VLSI Interconnects Under Ramp Input," IEEE/ACM International Conference on CAD, Nov. 1996, 7 pages.

* cited by examiner

INTERCONNECT CAPACITIVE EFFECTS ESTIMATION

CLAIM FOR BENEFIT OF EARLIER FILING DATE

A claim is hereby made for the benefit under 35 U.S.C 119(e) of a U.S. provisional application Ser. No. 60/123,262, filed Mar. 8, 1999, which is incorporated herein by reference.

FIELD OF THE INVENTION

This application relates to integrated circuit design automation and, specifically, to gate interconnect load estimation.

BACKGROUND OF THE INVENTION

Integrated circuit design includes selection and layout of gates also known as cells. The interconnections between the multiplicity of gates in an integrated circuit form signal paths. In most cases, the interconnections between gates form an interconnect tree (as shown in FIG. 1). The resistive, capacitive and inductive attributes of interconnect lines form gate loads at the respective gate outputs and contribute to signal time delays.

With interconnect delays dominating overall path delays for deep-submicron integrated circuits, heuristics for logic synthesis and layout optimization need to accurately model interconnect effects. Accurate estimations of gate delay and slew time are required for a number of signal integrity and reliability checks. In synthesis and floorplanning, pre-layout gate delay estimation capability is needed. In post-layout timing analysis, existing accurate gate delay estimates are not efficient enough to be used in the typical incremental synthesis, layout or in-place optimization loop or during performance-driven area routing. In either context, accurate estimations of gate delay and slew time at the gate output, depend closely on an accurate model for the admittance of an interconnect tree load at the gate output. The present invention addresses these and related issues.

SUMMARY OF THE INVENTION

The present invention provides a new non-iterative approach for estimating interconnect capacitive effects. This approach includes determining an effective capacitance that represents the interconnect capacitive effects at an output of a driving gate (hereafter "gate"). The effective capacitance estimation is preceded by a gate modeling.

The gate is modeled using, for example, a Thévenin equivalent circuit to solve a closed-form equation for the voltage response at the gate output. A closed-form equation is a single equation requiring only one iteration for deriving a solution.

Effective capacitance determination in accordance with this non-iterative approach involves modeling of an interconnect tree load at the gate output (i.e., the gate load). The gate load modeling uses an accurate RC Π model or open-ended (heuristic) RC Π model (hereafter collectively referred to as the "RC Π model"). The use of an open-ended RC Π model eliminates the need for moment computations at the gate output. The use of an accurate RC Π model requires a determination of the first three moments of the gate load admittance. The gate load modeling uses, in addition, a single capacitance model. Then the effective capacitance value is closely estimated by matching the RC Π model response with that of the single capacitance model.

The non-iterative approach includes a method for estimating the interconnect capacitive effects. The method includes modeling the gate and estimating an effective capacitance for the interconnect capacitive effects. The effective capacitance estimation includes modeling the gate load at an output of the gate. The gate load modeling includes approximating an admittance of the gate load to a single capacitance model in addition to approximating the admittance of the gate load to a Π model. The gate load modeling also includes matching a gate response for the Π model with the gate response for the single capacitance model to determine the effective capacitance.

Another aspect of the method for estimating the interconnect capacitive effects includes modeling the gate using an equivalent circuit, and modeling the load at an output of the gate. The gate load modeling includes determining Π model parameters that represent the load at the output of the gate. The parameters are associated with a response at the gate output. The effective capacitance estimation method further includes modeling a single capacitive load at the output of the gate. The single capacitive load modeling includes determining a gate delay for a threshold time at a threshold voltage. This delay determination accounts for the input voltage waveform, the voltage response at the gate output and the Π model parameters. The single capacitance modeling the capacitive load is determined using the threshold time. The effective capacitance is then derived taking into account the single capacitance, a total capacitance of the gate load, an intrinsic gate delay and a gate load delay for the total capacitance as a load.

For logic synthesis and layout optimization, this non-iterative approach models interconnect capacitive effects faster and with little or no loss of accuracy. Hence, this non-iterative approach is suitable as a step within the analysis loop for performance driven iterative layout optimization.

The non-iterative approach can, for example, be suitably implemented in timing analysis tools. Such tools are used for analysis and optimization of critical paths in integrated circuits design, including microprocessors design. Moreover, a computer system can be used in which an embodiment of the present invention is implemented Advantages of the invention will be set forth, in part, in the description that follows and, in part, will be understood by those skilled in the art from the description herein. The advantages of the invention will be realized and attained by means of the elements and combinations particularly pointed out in the appended claims and equivalents.

BRIEF DESCRIPTION OF THE DRAWINGS

The accompanying drawings, which are incorporated in and constitute a part of this specification, illustrate several embodiments of the invention and, together with the description, serve to explain the principles of the invention.

DETAILED DESCRIPTION OF THE INVENTION

The present invention provides a new non-iterative approach for estimating interconnect capacitive effects on gate output response. This non-iterative approach is considerably faster than conventional methods for computing effective capacitance, with little or no loss of accuracy. Hence, this non-iterative approach is suitable for logic synthesis and performance-driven layout optimization analysis. Moreover, this approach can be implemented in a computer system as a separate tool or as part of other design automation tools.

The non-iterative approach for estimating interconnect capacitive effects includes modeling both the gate and an interconnect tree load (also referred to as the "gate load") at the output of the gate. Modeling the gate load involves estimating an effective capacitance.

Modeling the gate load can be done by approximating an admittance of the gate load to a single capacitance model, in addition to approximating the admittance of the gate load to a Π model. After the admittance approximations, a gate response for the Π model is matched with the gate response for the single capacitance model to determine the effective capacitance.

Reference will hereafter be made in detail to embodiments of the invention, examples of which are illustrated in the accompanying drawings. Wherever convenient, the same reference numbers will be used throughout the drawings to refer to the same of like parts. The following discussion describes the issues in modeling the interconnect effects and the approach of the invention to solving them. The discussion first examines both the gate and gate load models. The discussion then describes how, in accordance with this invention, the gate and gate load models are used to estimate the interconnect capacitive effects.

I. The Gate Model

As mentioned, the modeling of interconnect capacitance effects on the gate output response includes modeling of the gate itself. The modeling of the gate can be accomplished in one of several ways, including: modeling the gate as a Thévenin equivalent circuit with an effective linear resistor driven by a voltage source; modeling the behavior of the gate using relevant parameters such as input slew time(s) and output load capacitance; and modeling the nonlinear gate characteristics using piece-wise linear device models.

Figure 1:
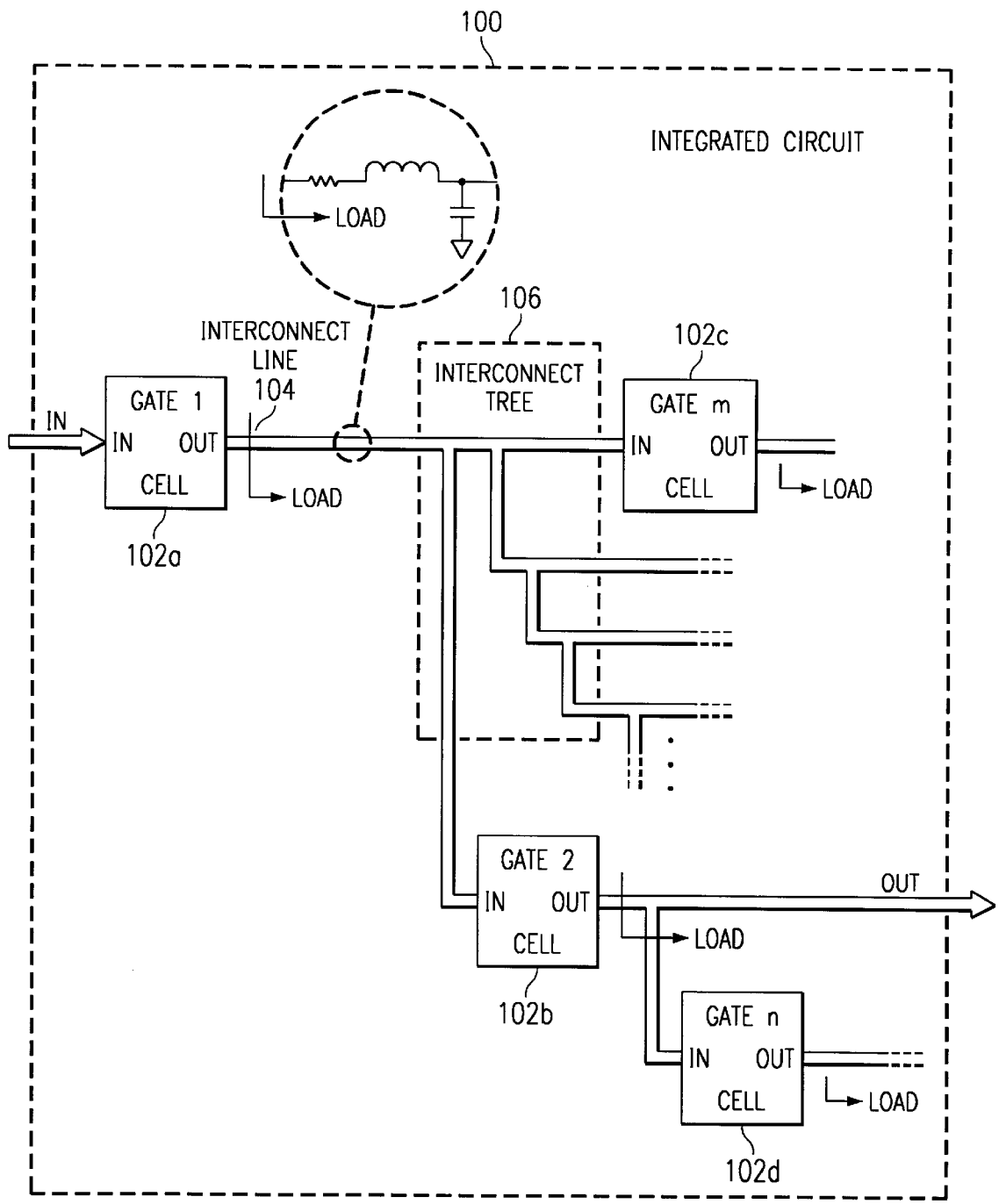
FIG. 1 shows an example of interconnections between gates including an interconnect tree.
Figure 2A:
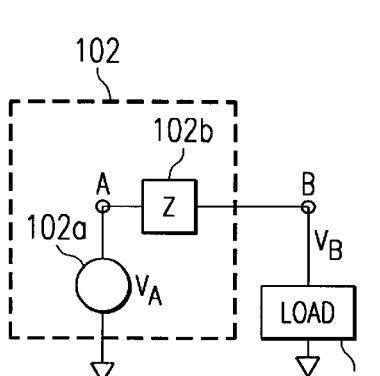
FIG. 2a illustrates a Thévenin model of the gate.

FIG. 2a illustrates a Thévenin model of the gate. In the Thévenin model, the gate 102 is replaced by a voltage source ($V_A$) 102a in series with the gate output impedance (Z) 102b (as seen from the load 104). The voltage source 102a represents the open-circuit voltage between the terminals (A and ground). In the Thévenin model of the gate, the effective gate impedance value is obtained such that the non-linear characteristics of the gate are approximated as a piece-wise linear resistor. A resistor of fixed value (R) can be used to model the gate by selecting an appropriate load capacitance to match, for example, the delay for a 50% threshold voltage ($V_{thd}$).

A more accurate model, called the slope model, uses a one-dimensional table to determine the effective gate impedance based on the ratio of input slew time and output slew time. Alternatively, pre-determined total gate delay for various load values is stored in a table format for each gate in a cell library.

Figure 2B:
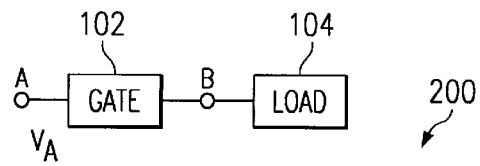
FIG. 2b illustrates a total gate delay for a threshold voltage at the gate output.
Figure 2B:
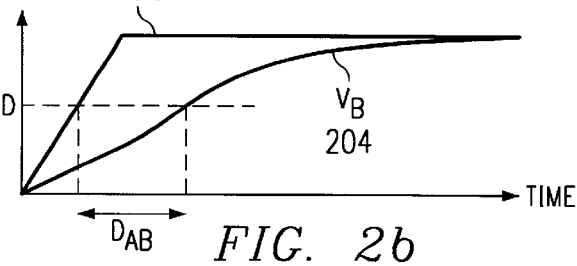

FIG. 2b illustrates a total gate delay for a threshold voltage at the gate output. The total gate delay $D_{AB}$ is expressed as the sum of an intrinsic gate delay of gate 102 and a gate load delay produced by load 104. The intrinsic gate delay is a delay attributed to the physical devices (e.g., transistors) in the gate. Intrinsic gate delay can be thought of as the total gate delay with an infinite load at the output. The intrinsic gate delay is known for each gate in the cell library. Data such as the cell library and delay tables may be stored in a computer readable medium including a computer memory.

For each gate in the cell library, at least two gate delay tables exist, one for delays and one for slew rates. To form the delay tables, delay and slew rates may be obtained (e.g., during modeling using a circuit simulator) by loading a given gate with a discrete load capacitor and then varying the load capacitance and input slew time. The format of delay tables is equivalent to the so-called empirical "K-factor" formula for delay and output rise time.

The delay table approach raises some methodology issues. For example, in actual layouts the gate output is connected via interconnects to other gate inputs. Modeling the load at the gate as a single load capacitor may work well for integrated circuit technologies where the area of interconnect at the gate output is small or the interconnect parameters are not dominant compared to gate parameters. However, with submicron technologies the interconnect resistance, capacitance, and inductance need to be considered in the delay table determination (the effects of inductance are increasingly important as integrated circuits geometry becomes smaller).

II. The Gate Load Model

As stated above, estimating the interconnect capacitive effects includes modeling the gate load in addition to modeling the gate. It may be recalled that the gate load is the load at the driving gate output. (The driving gate is hereafter referred to as the "gate.") An interconnection at a gate output produces the gate load. An interconnection may be an interconnect line or an interconnect tree with a number of interconnect lines. It is noted that the term "interconnect tree" is used as a collective term to describe an interconnect tree with any number of branches, i.e., single or multiple interconnect lines.

Typically, interconnections are metal lines that carry the signals between gates in the integrated circuit. Interconnect lines can be analyzed in terms of their resistive and capacitive components. More detailed models also include inductive components. In the illustrated models, the gate load produced by interconnections is a function of the resistive and capacitive components of the interconnections.

With narrower deep-submicron interconnect geometries, the resistive component of the gate load is comparable to or larger than the gate output resistance. The resistance of interconnect lines "shields" some load capacitance in that the load capacitance appears smaller with increases in the resistance.

Figure 3:
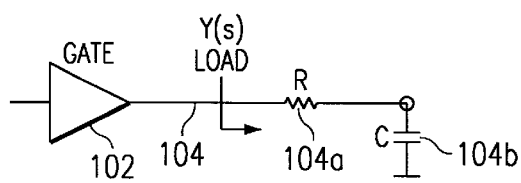
FIG. 3 illustrates an RC gate load shielding effect at the output of a gate in an integrated circuit designed in accordance with an embodiment of the invention.

FIG. 3 illustrates an RC gate load 104 shielding effect at the output of a gate 102 in an integrated circuit designed in accordance with an embodiment of the invention. The admittance Y(s) of the gate load is expressed as an inverse of the impedance Z(s):

$$Y_L(s) = sC(1 + RsC)^{-1}$$

where Y(s) decreases in inverse proportion to an increase in R. This decrease produces the shielding effect.

The resistance shielding effect is very significant for deep-submicron technologies because it effects the total gate delay. Namely, the total gate delay at the gate output decreases as a result of the interconnect resistance tending to shield some of the load capacitance. For example, the total gate delay at the output decreases when the gate output resistance is kept constant and the interconnect resistance of the load is increased. However, while the total gate delay decreases, the interconnect propagation delay increases as a result of the increase in interconnect resistance.

A primary approach to estimating gate delays is the modeling of admittance at the gate output. Gate delays are estimated using these models either through a delay table methodology or through an explicit simulation of the gate with the given load model.

In accordance with an embodiment of the invention, modeling the gate load can be done by approximating an admittance of the gate load to a single capacitance model, in addition to approximating the admittance of the gate load to a Π model. After the admittance approximations, a gate response for the Π model is matched with the gate response for the single capacitance model to determine the effective capacitance. Accordingly, the Π models and single capacitance model are described in detail below.

A. The Π Model

The Π model is an equivalent circuit in the form of a single Π network segment approximating the characteristics of the gate load at the respective gate output. The circuit may include resistive and capacitive or resistive, capacitive and inductive components. Although an interconnect line can be approximated to a distributed network, the following exemplary analysis presents a single network segment.

The Π models examined here, include the O'Brien/Savarino (accurate RC) Π model and the open-ended (heuristic) RC Π model. As exemplified, the Π models include a resistor and two capacitors. The Π models can also include an inductor. However, to simplify this discussion the inductor is omitted.

In the O'Brien/Savarino (accurate RC) Π model, the interconnect load tree is approximated by an RC Π model with a resistance and capacitance equaling the total interconnect resistance ($R_{tot}$) and capacitance ($C_{tot}$), respectively. For deep-submicron technologies, the total interconnect resistance is large and comparable to the gate output resistance. Thus, the actual delay is much smaller than the delay derived from an alternative total capacitance model because the interconnect resistance shields the load capacitance seen by the gate. With this approximation, the total interconnect load tree resistance shields the total capacitance.

Figure 4:
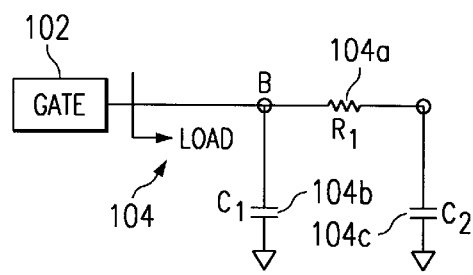
FIG. 4 illustrates the O'Brien/Savarino Π model.

FIG. 4 illustrates the O'Brien/Savarino Π model. The O'Brien/Savarino Π model approximates the interconnect load at the gate output by matching the first three moments of the interconnect load admittance at the gate output (i.e., as seen from the gate output).

In accordance with O'Brien/Savarino Π model, the admittance, $Y_L$, of the interconnect tree load 104 at the gate output (B) is represented by:

$$Y_L(s) = \sum_{i=1}^{\infty} A_i s^i = s A_1 + s^2 A_2 + s^3 A_3 + \ldots$$

The parameters of the equivalent circuit are obtained by matching the first three moments of the admittance with corresponding moments of the interconnect tree load admittance of the Π load model in FIG. 4. That is:

$$R_1 = \frac{-A_3^2}{A_2^3}, \; C_1 = A_1 - \frac{A_2^2}{A_3}, \; \text{and} \; C_2 = \frac{A_2^2}{A_3} \tag{1}$$

In accordance with the O'Brien/Savarino Π model, the delay tables need to be expanded from two-dimensional to space consuming four-dimensional tables. One dimension is the slew time of the input voltage. The other three dimensions are the three Π model parameters $R_1$, $C_1$, $C_2$ 104a, 104b and 104c, respectively.

A second Π model approach, the open-ended RC Π model, offers an alternative to the O'Brien/Savarino Π model for estimating the interconnect tree load admittance. The open-ended Π model provides a linear-time estimation.

Figure 5A:
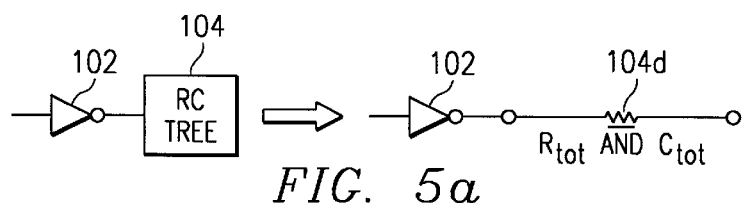
FIGS. 5a an 5b illustrate the open-ended model of an interconnect tree load at the gate output.

FIGS. 5a an 5b illustrate the open-ended model of an interconnect tree load 104 at a gate 102 output. The open-ended RC Π model approximates the entire interconnect tree 104 by an equivalent open-ended RC line whose resistance ($R_{tot}$) and capacitance ($C_{tot}$) 104d are equal to the total interconnect resistance and capacitance, as shown in FIG. 5(a). By using an open-ended RC line to approximate the entire tree, the distributed nature of the interconnect tree load is still considered in determining the model parameters. That is, the resistance of the open-ended RC line shields part of the load capacitance from the gate.

The one-segment RC Π model is open-ended in the sense that parameter values can be set to any value not exceeding the range determined by the total resistance ($R_{tot}$) and capacitance ($C_{tot}$) 104. In other words, the open-ended RC Π model is a one-segment RC Π model with predetermined parameter values that depend only on the total resistance ($R_{tot}$) and capacitance ($C_{tot}$) 104.

Figure 5B:
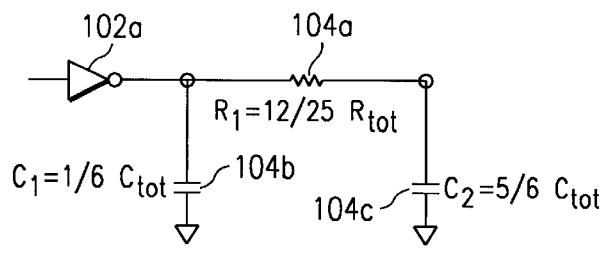

In accordance with this modeling approach, as illustrated in FIG. 5b, the admittance Y(s) of an open-ended RC line is approximated to:

$$Y(s) = \frac{\tanh(\theta)}{Z_0} = s C_{tot} - s^2 \frac{R_{tot} C_{tot}^2}{3} + s^3 \frac{2 R_{tot}^2 C_{tot}^2}{15} + \ldots$$

where the propagation constant $\theta = \sqrt{R_{tot} s C_{tot}}$ and the characteristic impedance $$Z_0 = \sqrt{\frac{R_{tot}}{s C_{tot}}}.$$

Therefore, the first three moments of the gate load admittance approximating the open-ended RC line are $$A_1 = C_{tot}, \; A_2 = -\frac{R_{tot} C_{tot}^2}{3}, \; A_3 = -\frac{2 R_{tot}^2 C_{tot}^3}{15}.$$

Using these values for $A_1$, $A_2$ and $A_3$, in equation (1) above yields Π model parameters as shown in FIG. 5(b):

$$R_1 = \frac{12 R_{tot}}{25}, \; C_1 = \frac{C_{tot}}{6}, \; \text{and} \; C_2 = \frac{5 C_{tot}}{6} \tag{2}$$

Figure 6A:
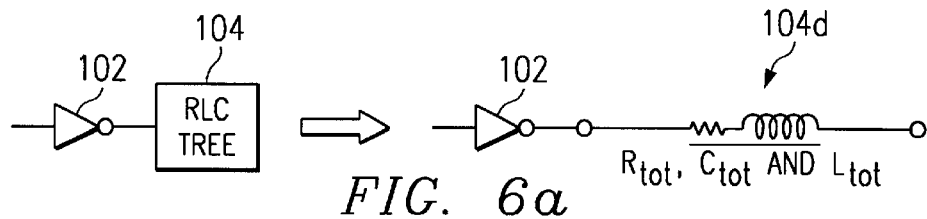
FIGS. 6a and 6b show the open-ended Π model extended to an RLC network.
Figure 6B:
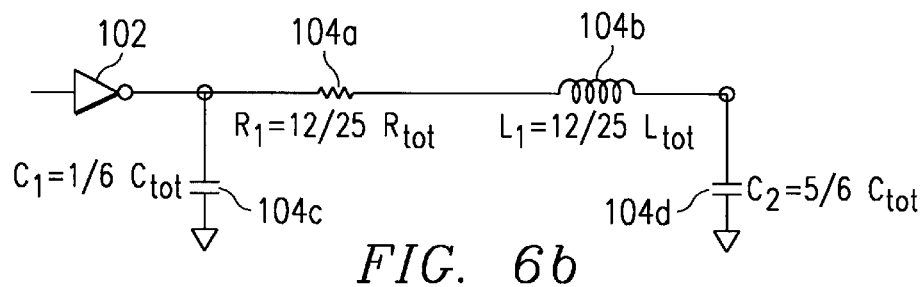

The open-ended Π model can be extended to RLC networks as shown in FIGS. 6a and 6b. Using this modeling approach to obtain the moments of the gate load admittance increases modeling efficiency because it avoids recursive interconnect tree traversal. Still, if the designer must account for all the possible combinations of $C_1$, $C_2$, $R_1$ in the Π model, a very large look-up table or highly complex K-factor formulas (along with a complex, resource consuming modeling process) would be required.

It may be recalled that estimating the interconnect capacitive effects can be done by approximating an admittance of the gate load to a single capacitance model, in addition to approximating the admittance of the gate load to a Π model. After the admittance approximations, a gate response for the Π model is matched with the gate response for the single capacitance model to determine the effective capacitance that represents the interconnect capacitive effects. Having first considered the Π model, attention is now turned to approximating the admittance of the gate load to the single capacitance model.

B. The Single Capacitance Model

Figure 7A:
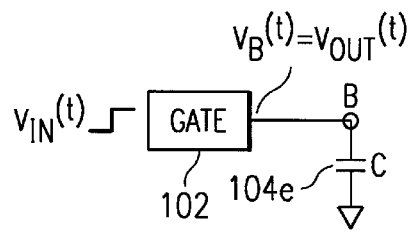
FIGS. 7a and 7b illustrate a capacitance model.
Figure 7B:
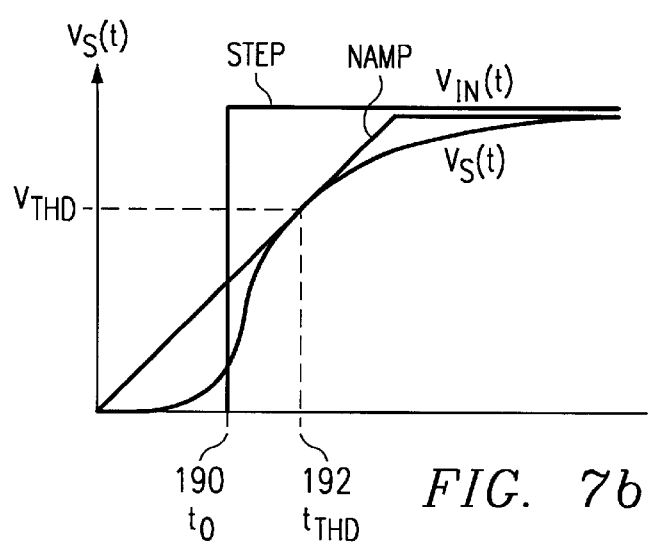

The gate load can be modeled using a delay table lookup approach with a single load capacitance to approximates the gate load. FIGS. 7a and 7b illustrate a single capacitance model of the load. Specifically, in response to the gate 102 input being excited with, for example, a step or ramp voltage waveform ($V_{in}(t)$), the voltage waveform ($V_s(t)$) at the gate output rises (or falls) to a particular level within the output voltage range. The time-domain response $v_{out}(t)$ at the gate output can be obtained as a function of the single capacitance, C, 104e. As the output voltage changes, it passes through voltage threshold points, one being the t=$t_0$ (or 0%) point 190 and the other being the t=$t_{thd}$ (or 50% or 75%, etc. ) point 192. It is for these endpoints that the capacitance, C, 104e is determined.

It is noted that the term "single capacitance model" means a model using a single capacitor to represent one capacitor or multiple capacitors arranged in series or parallel. In the case of the multiple capacitors in series or in parallel, the single capacitor is an equivalent of the multiple capacitors as is readily known.

III. The Effective Capacitance Estimation

As part of the interconnect capacitive effects estimation a non-iterative effective capacitance estimation technique is provided by the present invention. This approach is very useful with respect to each gate for providing an accurate estimation of gate load delays. This approach is less useful for accurate estimation with respect to downstream gates.

As stated before, the gate model and the gate load models (the Π model and the single capacitance model) are used in the interconnect capacitive effects estimation. Namely, once the gate and gate load modeling is done, the interconnect capacitive effects can be approximated to an effective capacitance. The effective capacitance can be determined from the gate and gate load models as hereafter described.

More particularly, in accordance with an embodiment of the invention, modeling of the interconnect tree load at the gate output (i.e., the gate load) uses the accurate RC Π model or open-ended (heuristic) RC Π model (hereafter collectively referred to as the "RC Π model"). The use of an open-ended RC Π model eliminates the need for moment computations at the gate output. The use of an accurate RC Π model requires a determination of the first three moments of the gate load admittance. Additionally, the gate is modeled using, for example, a Thévenin equivalent circuit to determine the voltage response at the gate output using the closed-form equation. As noted before, the closed-form equation is a single equation requiring only one iteration to derive a solution.

The effective capacitance value is closely estimated by matching the RC Π model response with that of the single capacitance model. A more detailed explanation of the non-iterative approach to estimating effective capacitance is now provided.

Figure 8A:
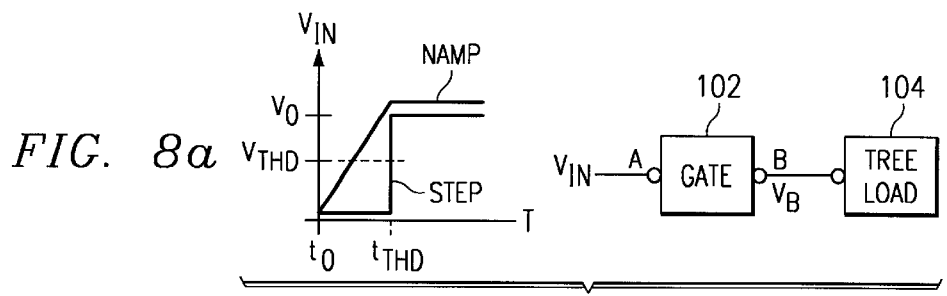
FIGS. 8(a)–8(e) illustrate the effective capacitance estimation in accordance with a non-iterative approach.

FIGS. 8(a)–8(e) illustrate the effective capacitance estimation in accordance with the non-iterative approach. In one embodiment, the effective capacitance estimation is performed using as an input a step voltage waveform, as shown in FIG. 8a. In a second embodiment, the effective capacitance estimation is performed using a ramp voltage waveform at the gate input, as is further shown in FIG. 8a.

Figure 8B:
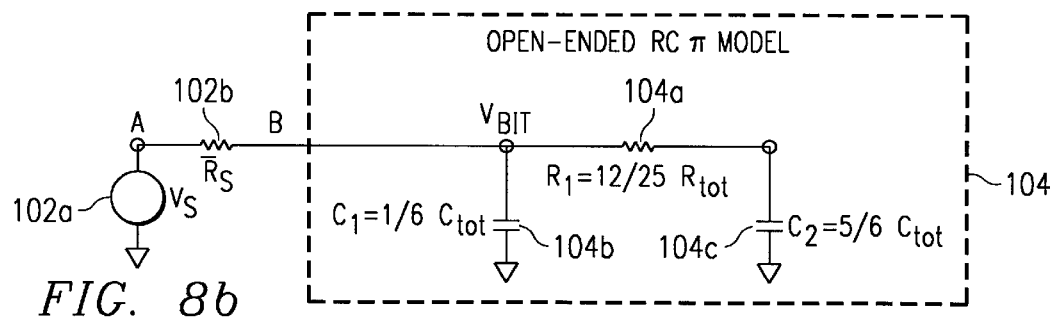
Figure 8C:
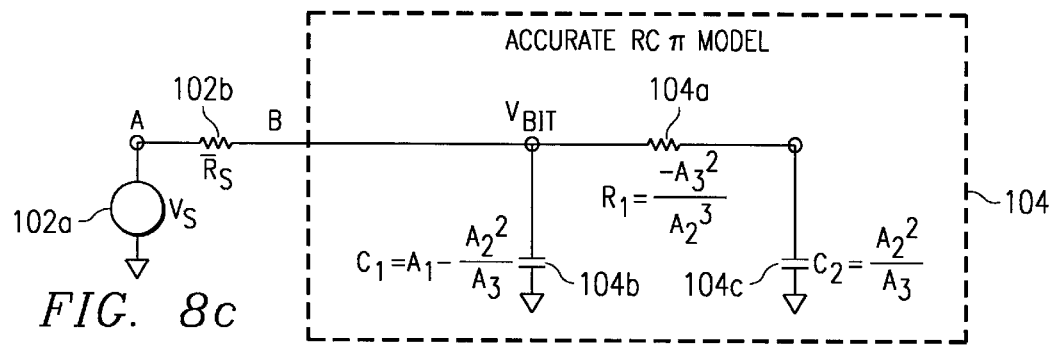

As shown in FIGS. 8b and 8c, the Thévenin equivalent circuit models the gate 102 by replacing it with a voltage source ($v_s(t)$) 102a and a linear source resistance ($R_s$) 102b. As indicated, in one embodiment the voltage source 102a provides a step voltage waveform. In the the second embodiment the voltage source 102a provides a ramp voltage waveform.

Initially, as shown in FIG. 8b, the interconnect tree load (the gate load) 104 at the gate output is modeled using an open-ended (heuristic) RC Π model. This RC Π model is used for determining the gate load admittance. The open-ended RC Π model includes a resistor ($R_1$) 104a and two capacitors ($C_1$ and $C_2$) 104b and 104c. An inductor (L) can be included as well to form an RLC Π model. However, for a simpler analysis the inductor is omitted. The open-ended RC Π model components, $R_1$, $C_1$ and $C_2$, are expressed as a function of the total interconnect capacitance ($C_{tot}$) and resistance ($R_{tot}$) The components $R_1$, $C_1$, and $C_2$, are determined n accordance with the relationships as indicated in equation (2).

Instead of the open-ended RC Π model as shown in FIG. 8b, the gate load modeling can use an accurate RC Π model as shown in FIG. 8c. In this instance, the accurate RC Π model components, $R_1$, $C_1$ and $C_2$, are determined by the relationships as indicated in equation (1).

Figure 8D:
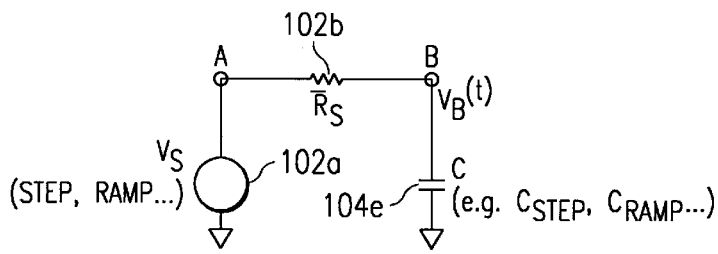
Figure 8E:
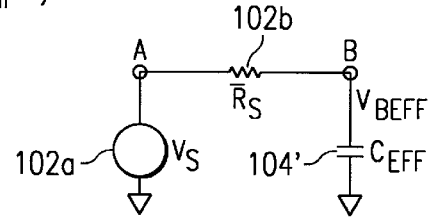

As a next step in estimating the interconnect capacitive effects, the gate load 104 is modeled using the single capacitance model, as shown in FIG. 8d. As previously explained, the value of the effective capacitance, $C_{eff}$, 104' (FIG. 8e) is closely estimated by matching the RC Π model response (FIGS. 8b or 8c) with that of the single capacitance model (FIG. 8d).

A. Effective Capacitance Estimation With Step Input

Starting with the step voltage waveform as an input ($V_{in}$) to the gate 102 (FIG. 8a). The gate output response ($V_B(s)$) produced thereby is analytically computed using the source resistance $R_S$ and the load which is modeled as the RC Π model as previously described.

Under these conditions, the response at the gate output (B) in the Laplace transform domain is given by the following transfer function:

$$V_B(s) = V_s(s) \frac{(1 + sR_1C_2)}{1 + s(R_sC_1 + R_sC_2 + R_1C_2) + s^2R_sR_1C_1C_2} \qquad (3)$$

$$= \frac{V_0}{s}\left[1 + \frac{(1+s_1R_1C_2)}{s_1b_2(s_1-s_2)}\frac{1}{(s-s_1)} + \frac{(1+s_2R_1C_2)}{s_2b_2(s_2-s_1)}\frac{1}{s-s_2)}\right]$$

where $$b_1 = R_s(C_1 + C_2) + R_1C_2$$

$$b_1 = R_sR_1C_1C_2$$

$$s_{1,2} = \frac{b_1 \pm \sqrt{b_1^2 - 4b_2}}{2b_2}$$

where $R_1$ 104a, $C_1$, 104b and $C_2$ 104c, are the components of the Π model, and $V_0$ is the output voltage that approximates the maximum $V_S$.

Depending on the sign of $b_1^2-4b_2$, the poles of the transfer function can be either real or complex. $V_B(t)$ is the reverse Laplace transform of the transfer function expressing the time domain gate output response. The time domain response, $V_B(t)$, is determined separately for each case, real and complex. Substituting the moments, $b_1$ and $b_2$, for the parameters in the above equation, produces:

$$b_1^2-4b_2=R_S^2(C_1+C_2)^2+R_1^2C_2^2+2R_SR_1C_2(C_2-C_1) \quad (4)$$

For the most part, especially in the case of open-ended RC Π models, the value of $C_2$ 104b is greater than $C_1$ 104b. Hence, the time domain response, $V_B(t)$, with a load at gate output (B) being represented by an RC Π model, is determined for real poles as follows:

$$V_B(t) = V_0 \left[ 1 + \frac{(1+s_1R_1C_2)}{s_1b_2(s_1-s_2)}e^{s_1t} + \frac{(1+s_2R_1C_2)}{s_1b_2(s_2-s_1)}e^{s_2t} \right] \quad (5)$$

This response is then used to determine the slew time (or delay with respect to input signal) at a specified threshold voltage by matching the results for a single capacitor as a gate load. Assuming that (in the step voltage waveform input case) the load is modeled as a single, step input capacitance, $C_{step}$. In other words:

$$V_B(t)=V_s(1-e^{-t/R_SC_{step}})$$

where $V_s$ approximates 100% of the gate output voltage represented by the voltage source 102a. $C_{step}$, the step input capacitance 104e, is the capacitor component of a single capacitance model that is excited by a step input waveform (FIG. 8d). It may be recalled that as the $V_B(t)$ changes it passes through threshold points $t=t_0$ and $t=t_{thd}$ set for determining the gate response delay (slew rate). Hence, also assuming, for $V_B(t)$, a threshold voltage, $V_{thd}$, that is greater than 0% and lower than 100% (e.g., 50%, 90% etc.). Then:

$$V_B(t)_{thd}=V_{thd},$$

and:

$$\frac{t_{thd}}{R_SC_{step}} = \frac{T_{out}^\Pi}{R_SC_{step}} = \ln\left(\frac{1}{1-V_{thd}}\right) = k_1,$$

where $k_1$ is a constant associated with the particular threshold voltage, $V_{thd}$, so that:

$$C_{step} = \frac{t_{thd}}{k_1R_S} = \frac{T_{out}^\Pi}{k_1R_S} \quad (6)$$

where $T_{out}^\Pi$ is the slew time for a Π model at the gate output for the particular $V_{thd}$.

Finally, the effective capacitance is determined in the range between the step input capacitance $C_{step}$ and the total load capacitance $C_{tot}$ under full load conditions. It may be recalled, that under no load condition the gate response is fast since the gate will not see the interconnect load capacitance. Under full load conditions the gate response is slow because it needs to charge a full capacitive load. The range between $C_{step}$ and $C_{tot}$ is set by obtaining the intrinsic gate delay $D_{NL}$ and the gate load delay $D_{LD}$. The intrinsic gate delay, $D_{NL}$, is a gate response delay with no load at the gate output, and the gate load delay, $D_{LD}$, is a gate response delay with $C_{tot}$ as a load. Intrinsic and gate load delays for specific loads are predetermined and can be obtained from K-factor formulas or look-up tables available for each gate in the cell library. Accordingly, $C_{eff}$ can be expressed as follows:

$$C_{eff} = C_{step} + (C_{tot} - C_{step})\frac{1}{1+D_{LD}/D_{NL}} \quad (7)$$

This implies that $$C_{eff} \approx C_{step} \text{ if } D_{LD}/D_{NL} >> 1,$$

and $$C_{eff} \approx C_{tot} \text{ if } D_{LD}/D_{NL} << 1.$$

Given the Π model parameters ($R_1,C_1,C_2$) and the predetermined output delay table for the gate, the above-described embodiment provides a non-iterative method for estimating the effective capacitance. The method for estimating the effective capacitance of an interconnect load when the gate is excited with a step voltage waveform includes steps as hereafter outlined. First, determine Π model parameters in accordance with the relationship as expressed in either equation (1) or equation (2). Second, determine the threshold time, $t_{thd}$, using a transfer function as demonstrated by equation (5) for the voltage response at the gate output. Third, determine the single capacitor, $C_{step}$, from $t_{thd}$ and $R_S$ using the relationship of equation (6). Fourth, obtain from the gate delay table the gate load delay $D_{LD}$ for the total capacitance, $C_{tot}$, as a load and the intrinsic gate delay $D_{NL}$ for the no load condition. Fifth, determine $C_{eff}$ using the relationship expressed in equation (7).

B. Effective Capacitance Estimation With Ramp Input

For a ramp voltage waveform as an input to the gate, the following effective capacitance estimation process is presented. In this case, the gate is modeled with a Thévenin equivalent circuit that replaces the gate with a ramp voltage source $V_S$ and a series source resistance $R_S$. The ramp voltage is characterized by rise time $T_R$. To approximate the entire interconnect load tree at the gate output, the RC Π model is used (as before). The voltage $V_B$ at the gate output (B) in the Laplace transform domain is:

$$V_B(s) = V_S(s) = \frac{(1+sR_1C_2)}{1+s(R_SC_1+R_SC_2+R_1C_2)+s^2R_SR_1C_1C_2}$$

$$= \frac{V_0(1-e^{-sT_R})}{T_R}\left[\frac{1}{s^2} - \frac{R_s(C_1+C_2)}{s} + \frac{(1+s_1R_1C_2)}{b_2s_1^2(s_1-s_2)}\frac{1}{(s-s_1)} - \frac{(1+s_2R_1C_2)}{b_2s_2^2(s_1-s_2)}\frac{1}{(s-s_2)}\right]$$

where:
$b_1=R_S(C_1+C_2)+R_1C_2,$
$b_2=R_SR_1C_1C_2,$ and:

$$s_{1,2} = \frac{-b_1 \pm \sqrt{b_1^2-4b_2}}{2b_2}$$

The time-domain response is:

$$V_B(t) = \frac{V_0}{T_R}\left[t - R_S(C_1+C_2) + \frac{(1+s_1R_1C_2)}{b_2s_1^2(s_1-s_2)}e^{s_1t} - \right. \quad (8)$$

-continued $$\frac{(1+s_1R_1C_2)}{b_2s_2^2(s_1-s_2)}e^{s_2t}\Bigg]$$

for $t \leq T_R$, and:

$$V_B(s) = \frac{V_O}{T_R}\Bigg[T_R + \frac{(1+s_1R_1C_2)(1-e^{-T_Rs_1})}{b_2s_1^2(s_1-s_2)}e^{s_1t} - \frac{(1+s_2R_1C_2)(1-e^{-T_Rs_1})}{b_2s_2^2(s_1-s_2)}e^{s_2t}\Bigg]$$

for $t > T_R$.

Depending on the sign of $b_1^2 - 4b_2$, the poles will be either real or complex. As before (equation (4)), the quantity $b_1^2 - 4b_2$ is positive. Accordingly, the case of real poles is analyzed here.

From the output response, $V_B(t)$, the threshold time, $t_{thd}$, is determined for a user-specified threshold voltage (e.g. 50%, 90% etc.). The ramp input capacitance, $C_{ramp}$, 104e is the capacitive component of the single capacitance model, excited by a ramp voltage waveform, as shown in FIG. 8d. The ramp input capacitance, $C_{ramp}$, is then determined for the given threshold time, $t_{thd}$ ($T_{out}^{\Pi}$ for $\Pi$ model) as follow:

$$C_{ramp} = \frac{t_{thd}}{k_2R_S} = \frac{T_{out}^{\Pi}}{k_2R_S} \tag{9}$$

where the constant $k_2$ is an absolute value expressed as:

$$k_2 = \left|\ln\left(\frac{1}{1+\frac{V_{thd}T_R}{R_SC_{tot}} - \frac{T_R}{R_SC_{tot}}}\right)\right| \text{ for } t \leq T_R, \tag{10}$$

and:

$$k_2 = \left|\ln\left(\frac{R_SC_{tot}}{T_R} \cdot \frac{\left(e^{\frac{1}{R_SC_{tot}/T_R}} - 1\right)}{(1-V_{thd})}\right)\right| \text{ for } t > T_R.$$

Finally, the effective capacitance, $C_{eff}$, is determined in the range between the ramp input capacitance $C_{ramp}$ and total load capacitance $C_{tot}$, as in the previous case. The intrinsic gate load, $D_{NL}$, and the gate load, $D_{LD}$, with $C_{tot}$ as the load, are then obtained from the k-factor formulas or delay tables for the gate. From the above, the the effective capacitance, $C_{eff}$, is determined as follows:

$$C_{eff} = C_{ramp} + (C_{tot} - C_{ramp}) \cdot \frac{1}{1+D_{LD}/D_{NL}} \tag{11}$$

This again implies that:

$C_{eff} \approx C_{step}$ if $D_{LD}/D_{NL} >> 1$, and $C_{eff} \approx C_{tot}$ if $D_{LD}/D_{NL} << 1$.

Given the $\Pi$ model parameters ($R_1, C_1, C_2$) and the predetermined output delay table for the gate, this embodiment provides a non-iterative method for estimating the effective capacitance. The following method for estimating the effective capacitance of an interconnect load is suitable when the gate is excited with a ramp voltage waveform. First, determine $\Pi$ model parameters using the relationships expressed in either equation (1) or equation (2). Second, determine the threshold time, $t_{thd}$, by determining the voltage response at the gate output based on a transfer function as expressed in equation (8). Third, determine the single capacitance, the ramp input capacitance $C_{ramp}$, from $t_{thd}$ and $R_S$ in accordance with the relationships as expressed in equations (9) and (10). Fourth, obtain from the gate delay table the gate load delay $D_{LD}$ for $C_{tot}$ as a load and the intrinsic gate delay $D_{NL}$ for the no load condition. Fifth, determine $C_{eff}$ using the relationship expressed in equation (11).

In summary, the present invention provides a new non-iterative approach for estimating the interconnect capacitive effects on the gate output response. This approach includes estimating the effective capacitance of an interconnect load at the gate output. For logic synthesis and layout optimization, this approach models interconnect effects more accurately. This non-iterative approach is considerably faster than conventional methods for computing effective capacitance, with little or no loss of accuracy. This approach for estimating effective capacitance works especially well for threshold voltages between 30% to 60%.

Accordingly this non-iterative approach is advantageous in providing accurate delay analysis within a tight synthesis-analysis loop. For instance, in performance-driven layout optimization, this non-iterative approach is suitable as a step within the analysis loop.

Other embodiments will be apparent to those skilled in the art from consideration of the specification and practice of the invention disclosed herein. It is intended that the specification and examples be considered as exemplary only, with a true scope of the invention being indicated by the following claims and equivalents.

What is claimed is:

1. A method for estimating interconnect capacitive effects, comprising:
   modeling a gate; and
   estimating an effective capacitance that models the interconnect capacitive effects, the effective capacitance estimation including:
      modeling a gate load at an output of the gate, including:
         approximating an admittance of the gate load to a single capacitance model; and
         approximating the admittance of the gate load to a $\Pi$ model; and
      matching a gate response for the $\Pi$ model with the gate response for the single capacitance model to determine the effective capacitance.

2. The method of claim 1, being implemented in a computer system.

3. A method of claim 1, wherein the effective capacitance has a value falling within a range extending between a total capacitance of the load and a capacitance of the single capacitance model, the capacitance being determined for a particular voltage waveform applied at an input of the gate and a threshold voltage at the gate output.

4. A method of claim 3, wherein the range is set by obtaining an intrinsic gate delay and a gate load delay, and wherein the intrinsic gate delay and the gate load delay are obtained using a table look-up.

5. A method of claim 3, wherein the voltage waveform is one of step and ramp voltage waveforms, and wherein based on the voltage waveform the single capacitance model includes one of a step input capacitance ($C_{step}$) and a ramp input capacitance ($C_{ramp}$).

6. The method of claim 1, wherein the gate is modeled using an equivalent circuit including a Thévenin equivalent with an impedance driven by a voltage source.

7. The method of claim 6, wherein the impedance is determined such that non-linear characteristics of the gate are approximated as a piece-wise linear resistor.

8. The method of claim 1, wherein the gate is modeled using parameters including a slew rate and load capacitance.

9. The method of claim 1, wherein the Π model is an RC Π model including a resistor and two capacitors.

10. The method of claim 1, wherein the Π model is an RLC model including a resistor, an inductor and two capacitors.

11. The method of claim 1, wherein the gate modeling is for solving a closed-form equation for a voltage response at a gate output.

12. A method for estimating interconnect capacitive effects on a response of a gate, comprising:

modeling the gate;

determining Π model parameters of a load at an output of the gate;

determining a gate delay for a threshold time ($t_{thd}$) at a threshold voltage taking into account the Π model parameters, the gate delay being associated with a voltage response at the gate output;

determining a capacitance of a single capacitance model of the load, the capacitance being dependent on the threshold time ($t_{thd}$);

obtaining from a gate delay table a gate load delay for a total capacitance ($C_{tot}$) as the load and an intrinsic gate delay for a no load condition; and determining an effective capacitance ($C_{eff}$) based on the capacitance of the single capacitance model, the intrinsic gate delay and the gate load delay.

13. A method of estimating interconnect capacitive effects, comprising:

modeling a gate using an equivalent circuit;

modeling a load at an output of the gate, including determining Π model parameters, the Π model representing the load at the gate output, the Π model parameters being associated with a response at the gate output;

modeling the load using a single capacitance model, including:

determining a threshold time corresponding to a threshold voltage at the gate output; and determining a capacitance of the single capacitance model using the threshold time;

obtaining an intrinsic gate delay;

obtaining a gate load delay for a total capacitance as a load; and determining an effective capacitance taking into account the capacitance of the single capacitance model, total capacitance, intrinsic gate delay and gate load delay.

14. The method of claim 13, being implemented in a computer system.

15. The method of claim 13, further comprising providing a voltage waveform at an input of the gate to produce a response at the gate output, and wherein the voltage waveform is one of step and ramp voltage waveforms.

16. The method of claim 13, wherein the equivalent circuit is a thévenin equivalent that substitutes the gate with a voltage source and a series resistor.

17. The method of claim 13, wherein the load is an interconnect tree load having a total resistance and the total capacitance, and wherein the parameters are determined in accordance with one of two relationships, a first of the two relationships being a function of the total capacitance and total resistance when the Π model is an open-ended Π model, and a second of the two relationships being a function of the first three moments of an admittance of the load when the Π model is an accurate Π model, the Π model approximating the load admittance.

18. The method of claim 13, wherein the intrinsic gate delay and gate load delay are predetermined for various load values and are obtained from a cell library.

19. The method of claim 18, wherein for each gate in the cell library at least two gate delay tables exist, one for a delay and one for a slew rate.

20. The method of claim 19, wherein the format of the gate delay tables is equivalent to empirical K-factor formulas for delay and slew rate.

* * * * *